United States Patent
Chen et al.

(10) Patent No.: US 11,075,365 B2
(45) Date of Patent: Jul. 27, 2021

(54) DISPLAY PANEL, METHOD FOR FABRICATING THE SAME, AND DISPLAY DEVICE

(71) Applicant: BOE Technology Group Co., Ltd., Beijing (CN)

(72) Inventors: Liang Chen, Beijing (CN); Lei Wang, Beijing (CN); Xiaochuan Chen, Beijing (CN); Minghua Xuan, Beijing (CN); Dongni Liu, Beijing (CN); Li Xiao, Beijing (CN); Ming Yang, Beijing (CN); Han Yue, Beijing (CN); Shengji Yang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/613,836

(22) PCT Filed: May 8, 2019

(86) PCT No.: PCT/CN2019/085958
§ 371 (c)(1),
(2) Date: Nov. 15, 2019

(87) PCT Pub. No.: WO2019/233234
PCT Pub. Date: Dec. 12, 2019

(65) Prior Publication Data
US 2021/0028409 A1    Jan. 28, 2021

(30) Foreign Application Priority Data

Jun. 5, 2018 (CN) .......................... 201810569981.X

(51) Int. Cl.
*H01L 51/56* (2006.01)
*G06F 3/041* (2006.01)
(Continued)

(52) U.S. Cl.
CPC ............ *H01L 51/56* (2013.01); *G06F 3/0412* (2013.01); *H01L 27/323* (2013.01);
(Continued)

(58) Field of Classification Search
CPC ... H01L 51/56; H01L 27/3246; H01L 27/323; H01L 27/3276; H01L 27/3258;
(Continued)

(56) References Cited

U.S. PATENT DOCUMENTS 5,814,417 A * 9/1998 Nagayama .......... H01L 51/5203
                                                         313/504
9,153,631 B2 * 10/2015 Sung .................... H01L 27/3244
(Continued)

FOREIGN PATENT DOCUMENTS

| CN | 103700694 A | 4/2014 |
| CN | 107168574 A | 9/2017 |

(Continued)

OTHER PUBLICATIONS

Chinese Office Action dated Oct. 9, 2019 in related Chinese Application No. 201810569981.X.

*Primary Examiner* — Vinh T Lam
(74) *Attorney, Agent, or Firm* — Arent Fox LLP; Michael Fainberg

(57) ABSTRACT

This disclosure discloses a display panel, a method for fabricating the same, and a display device. The method includes: forming a pattern of an electrode lead line layer on a substrate; forming connection structures on the pattern of the electrode lead line layer; forming a pattern of an intermediate layer including a light-emitting function layer on the connection structures and the light-emitting areas; forming a pattern of cathodes on the pattern of the intermediate layer; and irradiating the connection structures using laser from a side of the substrate so that the material of the
(Continued)

connection structures is melt, and forming through-holes at positions on the intermediate layer corresponding to the connection structures so that the melted material is connected with the cathodes through the through-holes.

20 Claims, 7 Drawing Sheets

(51) Int. Cl.
    *H01L 27/32*      (2006.01)
    *G06F 3/044*      (2006.01)

(52) U.S. Cl.
    CPC ...... *H01L 27/3246* (2013.01); *H01L 27/3258* (2013.01); *H01L 27/3276* (2013.01); *G06F 3/0443* (2019.05); *G06F 2203/04103* (2013.01); *H01L 2227/323* (2013.01); *H01L 2251/558* (2013.01)

(58) Field of Classification Search
    CPC ......... H01L 2251/558; H01L 2227/323; G06F 3/0412; G06F 2203/04103; G06F 3/0443
    See application file for complete search history.

(56) References Cited

U.S. PATENT DOCUMENTS

| | | | | |
|---|---|---|---|---|
| 9,679,511 | B2* | 6/2017 | Gu | .................. H01L 27/3248 |
| 10,134,330 | B2* | 11/2018 | Gu | .................. G09G 3/2003 |
| 2002/0070909 | A1* | 6/2002 | Asano | .................. H01L 27/326 |
| | | | | 345/76 |
| 2012/0064651 | A1* | 3/2012 | Shiozaki | ............. H01L 51/0011 |
| | | | | 438/35 |
| 2013/0002118 | A1* | 1/2013 | Ko | .................. G09G 3/3208 |
| | | | | 313/1 |
| 2014/0145164 | A1* | 5/2014 | Odaka | .................. H01L 51/529 |
| | | | | 257/40 |
| 2014/0346459 | A1* | 11/2014 | Song | .................. H01L 51/56 |
| | | | | 257/40 |
| 2016/0005801 | A1* | 1/2016 | Yamazaki | ........... H01L 27/3262 |
| | | | | 257/40 |
| 2016/0240598 | A1* | 8/2016 | You | .................. H01L 27/3276 |
| 2017/0220150 | A1* | 8/2017 | Wu | .................. H01L 51/5209 |
| 2017/0236886 | A1* | 8/2017 | Matsueda | ........... H01L 51/5246 |
| | | | | 257/40 |
| 2018/0204895 | A1* | 7/2018 | Lin | .................. H01L 27/3246 |
| 2019/0074475 | A1 | 3/2019 | Hou | |
| 2019/0280051 | A1* | 9/2019 | Cheng | .................. H01L 51/0005 |
| 2020/0067027 | A1* | 2/2020 | Yasumoto | .............. H01L 21/02 |
| 2020/0243629 | A1* | 7/2020 | Kishimoto | ............ H01L 29/786 |
| 2020/0303482 | A1* | 9/2020 | Kishimoto | .......... H01L 27/3244 |
| 2020/0357855 | A1* | 11/2020 | Tang | .................. H01L 27/323 |

FOREIGN PATENT DOCUMENTS

| | | |
|---|---|---|
| CN | 107393949 A | 11/2017 |
| CN | 108803928 A | 11/2018 |

* cited by examiner

DISPLAY PANEL, METHOD FOR FABRICATING THE SAME, AND DISPLAY DEVICE

This application is a US National Stage of International Application No. PCT/CN2019/085958, filed May 8, 2019, which claims the benefits of Chinese Patent Application No. 201810569981.X, filed with the Chinese Patent Office on Jun. 5, 2018, and entitled "A display panel, a method for fabricating the same, and a display device", which is hereby incorporated by reference in its entirety.

FIELD

This disclosure relates to the field of display technologies, and particularly to a display panel, a method for fabricating the same, and a display device.

BACKGROUND

An Organic Light-Emitting Diode (OLED) display panel has been widely favored due to a high response speed, high contrast, a wide angle of view, an ultra-small thickness, low power consumption, flexibility, etc., thereof.

SUMMARY

In a first aspect, an embodiment of this disclosure provides a method for fabricating a display panel. The method includes: forming a pattern of an electrode lead line layer on a substrate; forming connection structures on the pattern of the electrode lead line layer, where orthographic projections of the connection structures onto the substrate do not overlap with orthographic projections of respective light-emitting areas of the display panel onto the substrate; forming a pattern of an intermediate layer including a light-emitting function layer on the connection structures and the light-emitting areas; forming a pattern of cathodes on the pattern of the intermediate layer, where orthographic projections of the cathodes onto the substrate cover the orthographic projections of the connection structures onto the substrate; and irradiating the connection structures using laser from a side of the substrate so that the material of the connection structures is melt, and forming through-holes at positions on the intermediate layer corresponding to the connection structures so that the melted material is connected with the cathodes through the through-holes.

Optionally in the method for fabricating a display panel according to the embodiment of this disclosure, before forming the pattern of the intermediate layer, the method further includes: forming a thermally-insulating layer surrounding the connection structures, on the substrate formed with the connection structures.

Optionally in the method for fabricating a display panel according to the embodiment of this disclosure, an orthographic projection of the thermally-insulating layer onto the substrate does not overlap with the orthographic projections of the connection structures onto the substrate.

Optionally in the method for fabricating a display panel according to the embodiment of this disclosure, the thickness of the thermally-insulating layer in the direction perpendicular to the substrate ranges from 100 to 200 nanometers.

Optionally in the method for fabricating a display panel according to the embodiment of this disclosure, the thickness of the thermally-insulating layer is equal to the thickness of the connection structures in the direction perpendicular to the substrate.

Optionally in the method for fabricating a display panel according to the embodiment of this disclosure, before forming the intermediate layer, the method further includes: forming a pattern of a pixels definition layer on the substrate formed with the connection structures.

Optionally in the method for fabricating a display panel according to the embodiment of this disclosure, the pixels definition layer is reused as the thermally-insulating layer.

Optionally in the method for fabricating a display panel according to the embodiment of this disclosure, before forming the cathode layer, the method further includes: forming spacers on the substrate formed with the intermediate layer to segment a subsequently formed cathode layer into a plurality of cathode blocks insulated from each other.

Optionally in the method for fabricating a display panel according to the embodiment of this disclosure, forming a pattern of the thermally-insulating layer surrounding the connection structures on the electrode lead line layer includes: coating a polymer material on the electrode lead line layer; patterning the polymer material to form the pattern of the thermally-insulating layer; and grinding the top of the pattern of the thermally-insulating layer to expose the connection structures.

Optionally in the method for fabricating a display panel according to the embodiment of this disclosure, while the pattern of the electrode lead line layer is being formed, the method further includes: forming a pattern of a first electrode layer on the substrate using the same mask.

In a second aspect, an embodiment of this disclosure provides a display panel including: a substrate including a plurality of light-emitting areas; an electrode lead line layer located on the substrate, and including a plurality of electrode lead lines; connection structures located on a side of the electrode lead line layer away from the substrate, where orthographic projections of the connection structures onto the substrate do not overlap with orthographic projections of respective light-emitting areas of the display panel onto the substrate; an intermediate layer located on sides of the connection structures away from the substrate, and including at least a light-emitting function layer; and a cathode layer located on a side of the intermediate layer away from the substrate, wherein orthographic projections of cathodes onto the substrate cover the orthographic projections of the connection structures onto the substrate, and the connection structures run through the intermediate layer, so that the cathodes are electrically connected with corresponding electrode lead lines.

Optionally in the display panel according to the embodiment of this disclosure, the display panel further includes a thermally-insulating layer surrounding a part of the connection structures on the electrode lead line layer.

Optionally in the display panel according to the embodiment of this disclosure, an orthographic projection of the thermally-insulating layer onto the substrate does not overlap with the orthographic projections of the connection structures onto the substrate.

Optionally in the display panel according to the embodiment of this disclosure, the thickness of the thermally-insulating layer ranges from 100 to 200 nanometers in the direction perpendicular to the substrate.

Optionally in the display panel according to the embodiment of this disclosure, the thickness of the thermally-insulating layer is equal to the thickness of the connection structures in the direction perpendicular to the substrate.

Optionally in the display panel according to the embodiment of this disclosure, the display panel further includes a pixels definition layer. The pixels definition layer is located on the sides of the connection structures away from the substrate, and configured to define a position of the light-emitting function layer.

Optionally in the display panel according to the embodiment of this disclosure, the pixels definition layer is reused as the thermally-insulating layer.

Optionally in the display panel according to the embodiment of this disclosure, the display panel further includes a first electrode layer arranged at the same layer as the electrode lead line layer.

Optionally in the display panel according to the embodiment of this disclosure, the cathodes are reused as touch electrodes.

In a third aspect, an embodiment of this disclosure provides a display device including the display panel according to any one of the embodiments in the second aspect.

BRIEF DESCRIPTION OF THE DRAWINGS

In order to make the technical solutions according to the embodiments of this disclosure more apparent, the drawings to which reference is to be made in the description of the embodiments will be introduced below in brief, and apparently the drawings to be described below are only some embodiments of this disclosure. Those ordinarily skilled in the art can further derive from these drawings to obtain other drawings without any inventive effort.

DETAILED DESCRIPTION OF THE EMBODIMENTS

Figure 1:
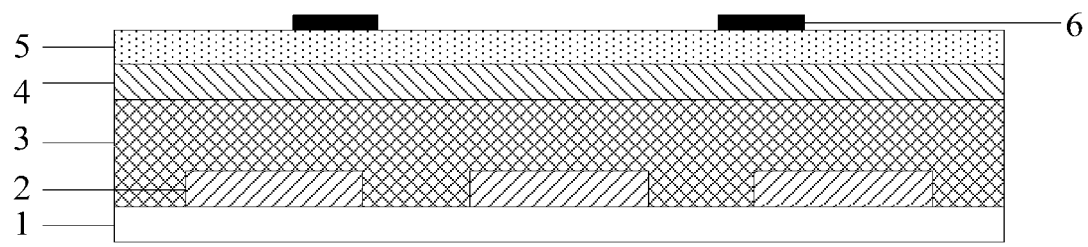
FIG. 1 is a schematic structural diagram of an on-cell touch display panel in the related art.

In the related art, an OLED display screen has a very small thickness. A touch layer may be integrated in the screen. The existing OLED product generally operates in an on-cell touch mode. As illustrated in FIG. 1, an on-cell touch display panel of the OLED display screen includes anodes 2, a light-emitting layer 3, a cathode 4, a TFE encapsulation layer 5, and a touch electrode layer 6, which are arranged on a substrate 1 in that order. The touch electrode layer 6 is formed on the TFE encapsulation layer 5, to thereby dispense with a touch sense panel so as to make the screen thinner, but touch and display driving chips can not be integrated therein.

Figure 2:
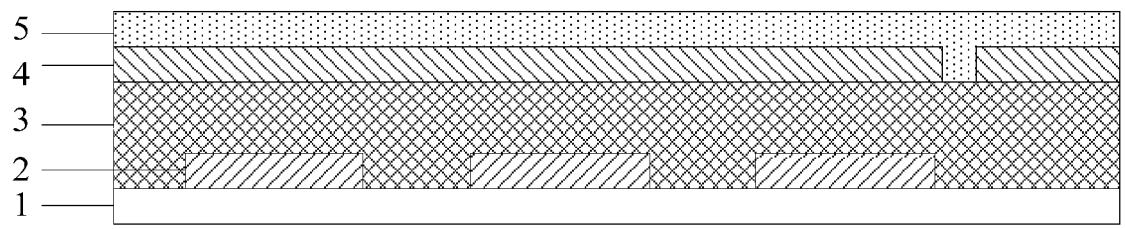
FIG. 2 is a schematic structural diagram of an in-cell touch display panel in the related art.

The touch and display driving chips can be integrated in the OLED display screen in an in-cell touch mode. For example, in a Full In-Cell (FIC) solution, touch lines are designed at a single layer, and a multi-point touch operation is performed under the self-capacitance principle. As illustrated in FIG. 2, in the FIC solution, the cathode 4 is segmented, that is, the cathode 4 is not arranged as an integral layer, so that the cathode 4 can be reused as touch electrodes. The display electrodes can be reused as the touch electrodes without forming any additional touch electrodes, to thereby simplify a fabrication process and lower a cost. However the cathodes are arranged at the same layer as touch lines, and if the size of the display panel is increased, a touch line area (a blind touch area) may be too large. In summary, in the related art, the touch lines are arranged at the same layer as the cathodes in the in-cell touch mode in which the touch and display driving chips are integrated so that the blind touch area may be too large, thus degrading a touch effect.

In view of the problem above, a display panel, a method for fabricating the same, and a display device according to the embodiments of this disclosure are provided. In order to make the objects, the technical solutions, and the advantages of this disclosure more apparent, this disclosure will be described below in further details with reference to the drawings. The embodiments here are only a part but not all of the embodiments of this disclosure, and only intended to illustrate and explain this disclosure, but not intended to limit this disclosure thereto. The embodiments of this disclosure, and the features of the embodiments can be combined with each other unless they conflict with each other. Furthermore based upon the embodiments here of this disclosure, all the other embodiments which can occur to those ordinarily skilled in the art without any inventive effort shall fall into the claimed scope of this disclosure.

It shall be noted that the shapes and the sizes of respective components in the drawings are not intended to reflect any real proportion, but only intended to illustrate this disclosure. Like or similar reference numerals will refer to like or similar elements, or elements with like or similar functions throughout the drawings.

Figure 3:
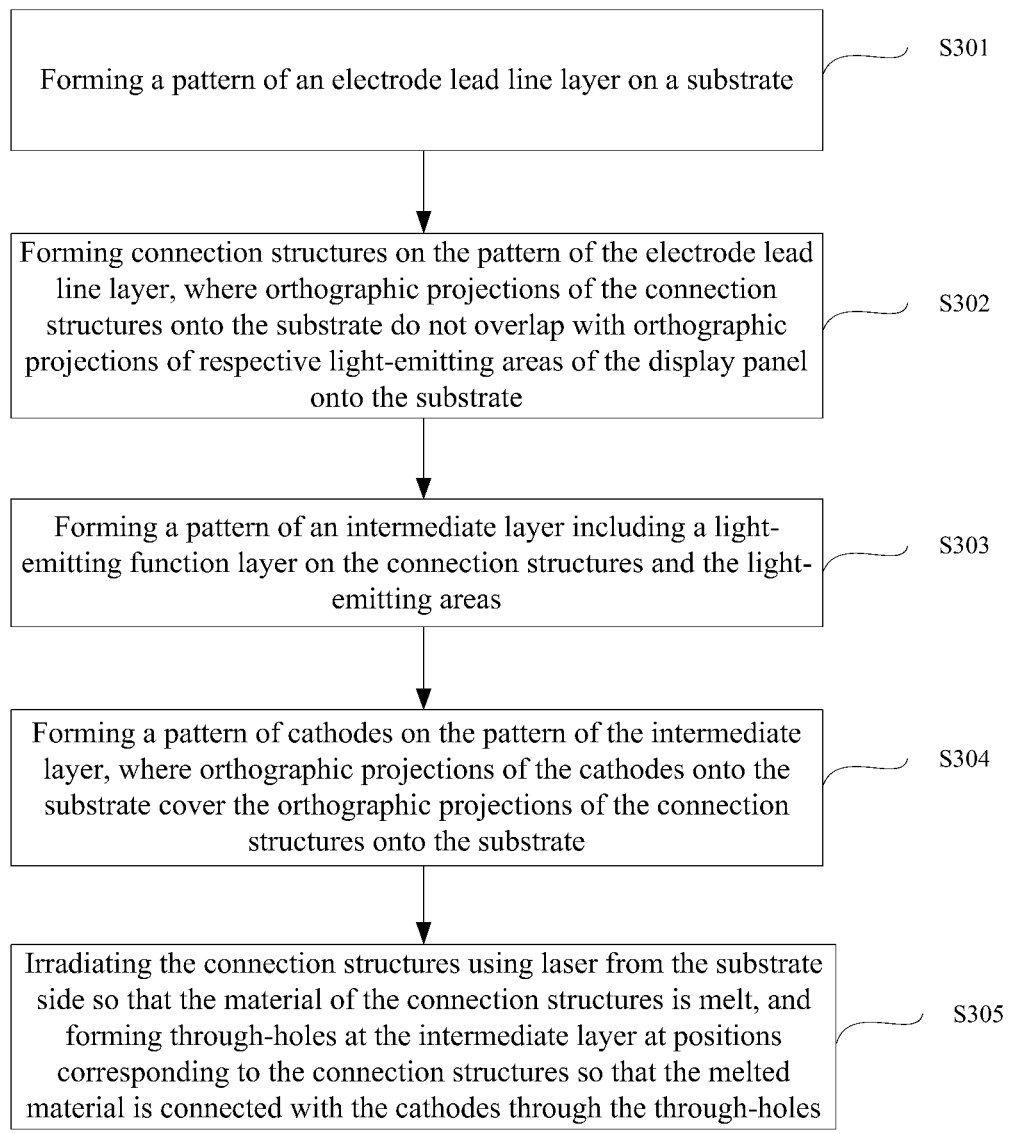
FIG. 3 is a schematic flow chart of a method for fabricating a display panel according to some embodiments of this disclosure.

An embodiment of this disclosure provides a method for fabricating a display panel. As illustrated in FIG. 3, the method includes the following steps.

The step S301 is to form a pattern of an electrode lead line layer on a substrate.

The step S302 is to form connection structures on the pattern of the electrode lead line layer, where orthographic projections of the connection structures onto the substrate do not overlap with orthographic projections of respective light-emitting areas of the display panel onto the substrate.

The step S303 is to form a pattern of an intermediate layer including a light-emitting function layer on the connection structures and the light-emitting areas.

The step S304 is to form a pattern of cathodes on the pattern of the intermediate layer, where orthographic projections of the cathodes onto the substrate cover the orthographic projections of the connection structures onto the substrate.

The step S305 is to irradiate the connection structures using laser from a side of the substrate so that the material of the connection structures is melt, and to form throughholes at positions on the intermediate layer corresponding to the connection structures so that the melted material is connected with the cathodes through the through-holes.

In the method for fabricating a display panel according to the embodiment of this disclosure, when a cathode layer includes a plurality of cathode blocks insulated from each other, the respective cathodes are connected with the electrode lead line layer located at a different layer from the cathodes, so that a routed line space of the display panel can be saved. The cathodes are connected with complicated metal lines or thin film transistors through the electrode lead line layer arranged on the sides of the cathodes proximate to the substrate. That is, in the display panel according to the embodiment of this disclosure, pixel circuits of the display panel can be modified more flexibly without damaging the cathodes and the intermediate layer, so as to improve the diversity of functions of the display panel so that the display panel may be applied more widely. When the cathodes are touch electrodes, a blind touch area may be avoided from becoming too large when the touch electrodes are arranged at the same layer as touch lines, to thereby improve the touch precision and the touch effect. Furthermore the laser may be incident on the material of the connection structures from the substrate side to thereby melt the material without damaging any other layers.

Additionally when the cathode layer is arranged integral, the connection structures in the display panel fabricated using the method above are melted to thereby connect the electrode lead lines on the substrate with the positions at the cathode layer so as to reduce a voltage drop across the cathode layer, thus improving the display quality.

It shall be noted that the substrate is a polyimide (PI) substrate. The laser is incident from a side of the substrate. The wavelength of the laser may be selected so that the laser at the selected wavelength may melt the material of the connection structures without being absorbed by the substrate. After forming the pattern of the cathodes in the step S304, and before the connection structures are melted using the laser, the method optionally further includes the step of encapsulating the display panel using an encapsulation layer. For example, the display panel may be encapsulated using the Thin Film Encapsulation (TFE) technology. In the method above for fabricating a display panel according to the embodiment of this disclosure, the laser is incident from a side of the substrate side, so that the TFE thin film may be avoided from being damaged.

Optionally before forming the pattern of the intermediate layer, the method further includes: forming a thermally-insulating layer surrounding the connection structures on the substrate formed with the connection structures.

In the method for fabricating a display panel according to the embodiment of this disclosure, since the thermally-insulating layer is arranged between the connection structures and the intermediate layer, so the light-emitting function layer is alleviated from being affected by the laser while the material of the connection structures is being subsequently melted using the laser, so that the cathodes are connected with the electrode lead line layer without affecting the light-emission effect of the display panel.

The material of the thermally-insulating layer is a material with a high specific heat capacity. The specific heat capacity represents the capacity of an object to absorb or dissipate heat, and it refers to the amount of heat absorbed or dissipated by some substance in a unit of mass after its temperature rises or drops by a unit of temperature. When the specific heat capacity is higher, the substance is heated by absorbing more heat. If the object is heated using the same amount of heat, the temperature of the object with a higher specific heat capacity will rise more slowly. Since there is a high specific heat capacity of a polymer material, the thermally-insulating layer is preferably made of the polymer material. Moreover the polymer material with a low thermal conductivity is an excellent thermally-insulating and temperature-preserving material. For example, the thermally-insulating layer is made of polypropylene, polyisobutylene, polystyrene, polyvinyl chloride, polymethyl methacrylate, polyethylene terephthalate, polyurethane, polycarbonate, epoxy resin, etc.

Figure 4:
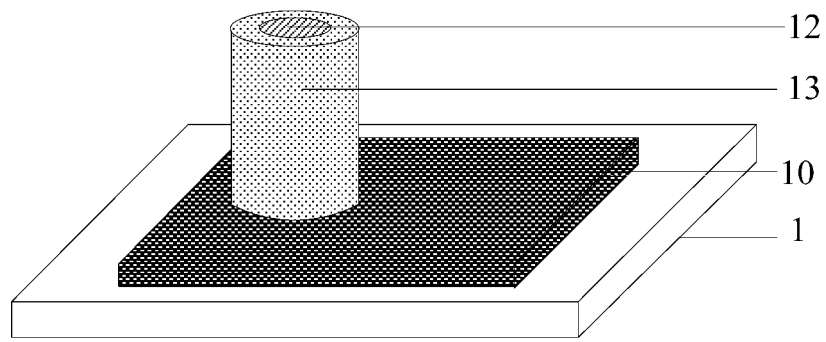
FIG. 4 is a schematic structural diagram of a display panel fabricated using the method for fabricating a display panel according to some embodiments of this disclosure.

FIG. 4 illustrates the structure of the display panel after the pattern of the thermally-insulating layer is formed, where the structure includes the substrate 1, the electrode lead line layer 10, the connection structures 12, and the thermally-insulating layer 13. The connection structures 12 are cylindrical, and the thermally-insulating layer 13 surrounding the connection structures 12 is also cylindrical. The connection structures and the thermally-insulating layer may alternatively be in another structural shape.

Optionally in the method for fabricating a display panel according to the embodiment of this disclosure, an orthographic projection of the thermally-insulating layer onto the substrate does not overlap with the orthographic projections of the connection structures onto the substrate.

In the fabrication processes, the thermally-insulating layer may cover the surfaces of the connection structures away from the substrate, and in order to make it more convenient to connect the melted connection structures with the cathodes after the connection structures are melted using the laser, the thermally-insulating layer shall be patterned by removing the thermally-insulating layer on the sides of the connection structures away from the substrate so that the orthographic projection of the thermally-insulating layer onto the substrate does not overlap with the orthographic projections of the connection structures onto the substrate.

Optionally in the method for fabricating a display panel according to the embodiment of this disclosure, the thickness of the thermally-insulating layer in the direction perpendicular to the substrate ranges from 100 to 200 nanometers.

It shall be noted that the light-emitting function layer includes a light-emitting material layer, and the thickness of the thermally-insulating layer is no less than the distance between the light-emitting material layer and the electrode lead line layer in the direction perpendicular to the substrate (generally 100 to 200 nanometers), so that the light-emitting material layer can be avoided from being affected by thermal conduction to thereby avoid light from being emitted poorly. An area corresponding to a normal projection of a first electrode layer in the direction perpendicular to the substrate is a working light-emitting area in a pixel area, and the light-emitting function layer located between the thermally-insulating layer and the cathode lies out of the working light-emitting area, so the light-emission effect in the pixel area will not be affected even if the laser acts on this part of the light-emitting function layer.

Of course, the thickness of the thermally-insulating layer is alternatively equal to the thickness of the connection structures in the direction perpendicular to the substrate to thereby better protect the performance of an adjacent layer.

Optionally in the method for fabricating a display panel according to the embodiment of this disclosure, before the intermediate layer is formed, the method further includes: forming a pattern of a pixels definition layer on the substrate formed with the connection structures.

The pixels definition layer is arranged to define the position of the light-emitting function layer, and when the cathode layer is arranged integral, in order to reduce a voltage drop across the cathode layer through the melted connection structures, the pixels definition layer is reused as the thermally-insulating layer.

Optionally in the method for fabricating a display panel according to the embodiment of this disclosure, before the cathode layer is formed, the method further includes: forming spacers on the substrate formed with the intermediate layer to segment a subsequently formed cathode layer into a plurality of cathode blocks insulated from each other.

When the cathode layer is reused as the touch electrodes, the cathode layer includes the plurality of cathode blocks insulated from each other. In order to form the respective cathode blocks insulated from each other, the spacers are arranged in other areas than the light-emitting areas before the cathode layer is formed. The distance between the surfaces of the spacers away from the substrate, and the substrate are more than the sum of the distance between the upper surface of the intermediate layer, and the substrate, and the thickness of the cathode layer, so that there is a step between adjacent cathode blocks, so the cathode blocks are insulated from each other. The spacers are arranged at the pixels definition layer, where the shape of the spacers is an upside-down trapezium.

Optionally the thermally-insulating layer is made of a polymer material, for example, and forming a pattern of the thermally-insulating layer surrounding the connection structures on the electrode lead line layer includes: coating a polymer material on the electrode lead line layer; patterning the polymer material to form the pattern of the thermally-insulating layer; and grinding the top of the pattern of the thermally-insulating layer to expose the connection structures.

Preferably the structure of the ground display panel is further rinsed after the pattern of the thermally-insulating layer is formed.

Optionally while the pattern of the electrode lead line layer is being formed, the method further includes forming a pattern of a first electrode layer on the substrate using the same mask.

In this way, the electrode lead line layer can be made of the same material as the first electrode layer, and the pattern of the electrode lead line layer can be formed while the pattern of the first electrode layer is being formed, thus simplifying the fabrication process. It shall be noted that the first electrode layer can include anodes, for example, so the intermediate layer is the light-emitting function layer.

Optionally before the pattern of the intermediate layer, and the pattern of the cathodes are formed, the method further includes the step of forming a pattern of a pixels definition layer, and a pattern of spacers.

Figure 5:
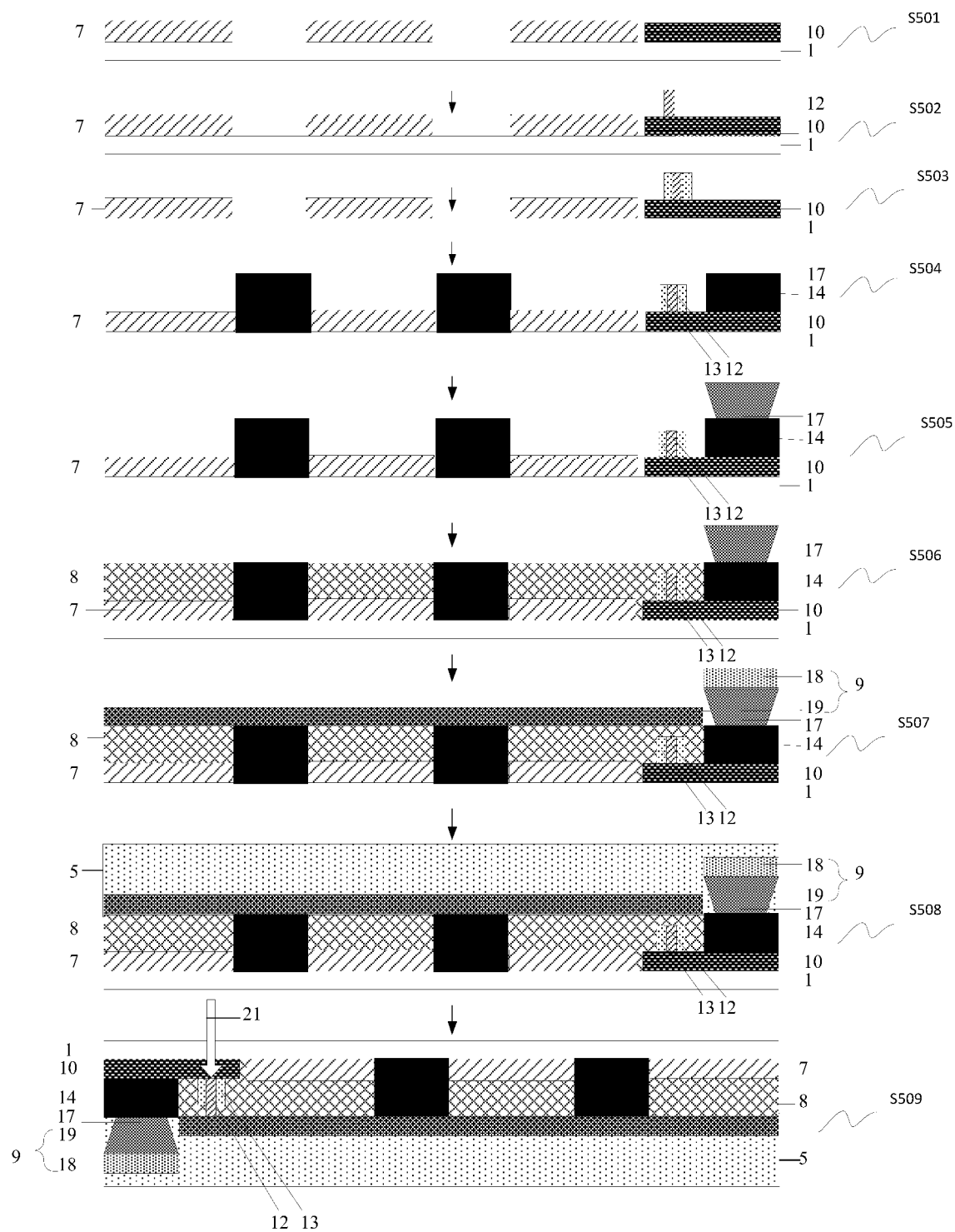
FIG. 5 is a schematic flow chart of another method for fabricating a display panel according to some embodiments of this disclosure.

Next the method for fabricating a display panel according to the embodiment of this disclosure will be described by way of an example in which the electrode lead line layer is arranged at the same layer as the first electrode layer, the thermally-insulating layer is formed on the electrode lead line layer to surround the connection structures, and the pattern of the pixels definition layer, and the pattern of the spacers are formed, and as illustrated in FIG. 5, the method for fabricating a display panel includes the following steps.

The step S501 is to form the pattern of the first electrode layer 7 and the electrode lead line layer 10 on the substrate 1.

The step S502 is to form the pattern of the connection structures 12 on the electrode lead line layer 10.

For example, the pattern of the connection structures can be formed in an electroplating process or a photolithograph process, the connection structures can be made of the same material as the electrode lead line layer and the first electrode layer, and the connection structures can be cylindrical, for example.

The step S503 is to form the pattern of the thermally-insulating layer 13 on the electrode lead line layer 10 to surround the connection structures 12.

The step S504 is to form the pattern of the pixels definition layer 14.

The step S505 is to form the pattern of the spacers 17.

As illustrated in FIG. 5, the shape of the cross section of each spacer 17 is an upside-down trapezium, that is, the area of the cross section of the spacer 17 is increasing gradually in the direction from the substrate 1 to the pixels definition layer 14.

The step S506 is to form the pattern of the light-emitting function layer 8.

For example, the structure of the display substrate after the step S505 is performed can be transferred to a vacuum environment, and the light-emitting function layer can be formed in a vapor-plating process.

The step S507 is to form the pattern of the cathodes 9.

Where each cathode 9 includes a first sub-electrode 18 and a second sub-electrode 19.

Since the cross section of each spacer 17 is an upside-down trapezium, the material of the cathodes can be vapor-plated throughout the cathode layer to form first sub-electrodes and second sub-electrodes insulated from each other.

The step S508 is to TFE-encapsulate the structure of the display panel after the step S507 is performed, to form the TFE encapsulation layer 5.

The step S509 is to irritate the display panel using the laser 21 from a side of the substrate 1 to melt the material of the connection structures 12, and to form the through-holes at the intermediate layer so that the melted material of the connection structures 12 is connected with the cathodes through the through-holes.

Figure 6:
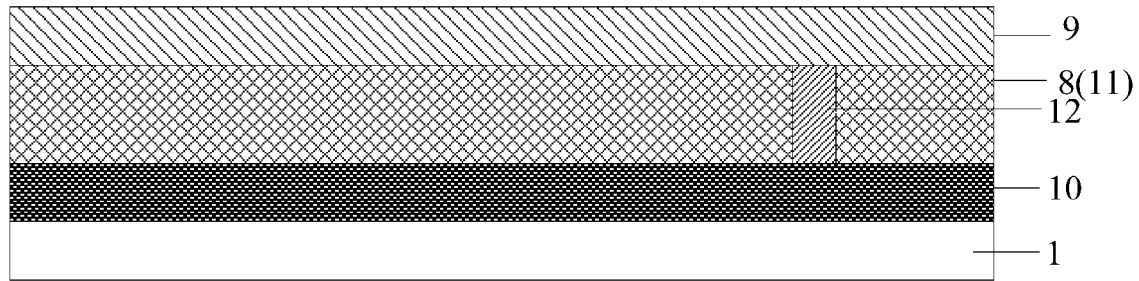
FIG. 6 is a schematic structural diagram of a display panel according to some embodiments of this disclosure.

Based upon the same inventive idea, an embodiment of this disclosure further provides a display panel fabricated using the method above for fabricating a display panel, and as illustrated in FIG. 6, the display panel includes: a substrate 1 including a plurality of light-emitting areas; an electrode lead line layer 10 located on the substrate 1, and including a plurality of electrode lead lines; connection structures 12 located on a side of the electrode lead line layer 10 away from the substrate 1, where orthographic projections of the connection structures 12 onto the substrate 1 do not overlap with orthographic projections of respective light-emitting areas of the display panel onto the substrate; an intermediate layer 11 located on the sides of the connection structures 12 away from the substrate 1, and including at least a light-emitting function layer; and a cathode layer 9 located on a side of the intermediate layer away from the substrate 1, where orthographic projections of the cathodes onto the substrate 1 cover the orthographic projections of the connection structures 12 onto the substrate 1, and the connection structures 12 run through the intermediate layer 11, so that the cathodes are electrically connected with their corresponding electrode lead lines.

In the display panel according to the embodiment of this disclosure, the cathodes are connected with the electrode lead line layer located at a different layer from the cathodes so that a routed line space of the display panel can be saved, and the cathodes can be connected with complicated metal lines or thin film transistors through the electrode lead line layer arranged on the sides of the cathodes proximate to the substrate, that is, in the display panel according to the embodiment of this disclosure, pixel circuits of the display panel can be modified more flexibly without damaging the cathodes and the intermediate layer, so as to improve the diversity of functions of the display panel so that the display panel can be applied more widely. When the cathodes are touch electrodes, a blind touch area can be avoided from becoming too large when the touch electrodes are arranged at the same layer as touch lines, to thereby improve the touch precision and the touch effect.

Additionally when the cathode layer is arranged integral, the connection structures in the display panel fabricated using the method above can be melted to thereby connect the electrode lead lines on the substrate with the positions at the cathode layer so as to reduce a voltage drop across the cathode layer, thus improving the display quality.

Figure 7:
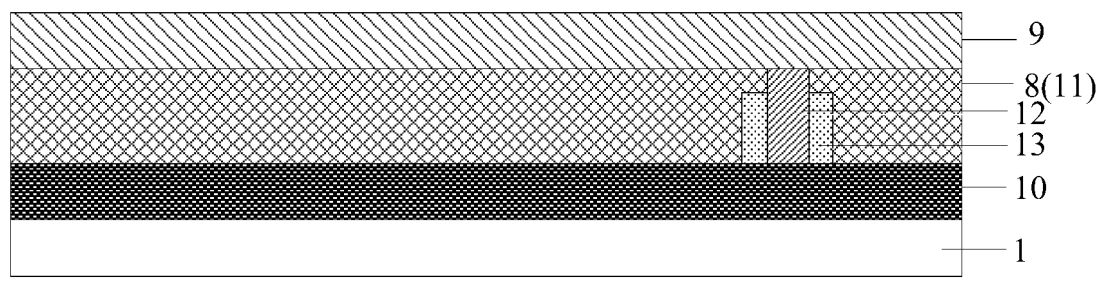
FIG. 7 is a schematic structural diagram of another display panel according to some embodiments of this disclosure.

Optionally as illustrated in FIG. 7, the display panel further includes a thermally-insulating layer 13 surrounding a part of the connection structures 12, on the electrode lead line layer 10. The thermally-insulating layer includes a part of the connection structures so that the intermediate layer can be avoided from being affected by thermal conduction while the display panel is being fabricated, to thereby avoid the light-emission effect of the display panel from being degraded.

Optionally in the display panel according to the embodiment of this disclosure, an orthographic projection of the thermally-insulating layer onto the substrate does not overlap with the orthographic projections of the connection structures onto the substrate.

In the fabrication processes, the thermally-insulating layer may cover the surfaces of the connection structures away from the substrate, and in order to make it more convenient to connect the melted connection structures with the cathodes after the connection structures are melted using the laser, the thermally-insulating layer shall be patterned by removing the thermally-insulating layer on the sides of the connection structures away from the substrate so that the normal projection of the thermally-insulating layer onto the substrate does not overlap with the orthographic projections of the connection structures onto the substrate.

Optionally in the display panel according to the embodiment of this disclosure, the thickness of the thermally-insulating layer in the direction perpendicular to the substrate ranges from 100 to 200 nanometers.

Of course, the thickness of the thermally-insulating layer can alternatively be set to the thickness of the connection structures in the direction perpendicular to the substrate to thereby better protect the performance of an adjacent layer.

Figure 8:
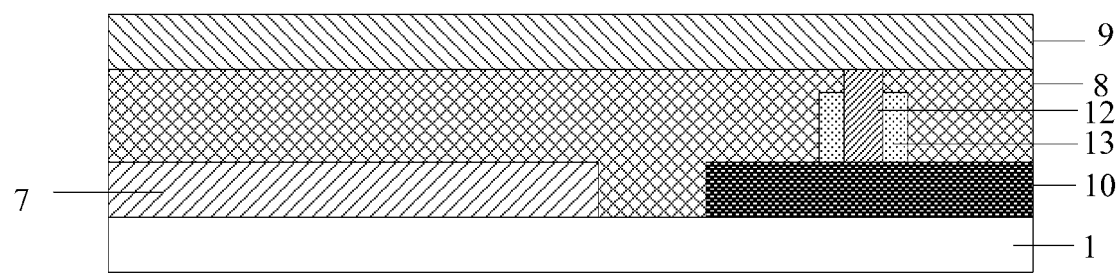
FIG. 8 is a schematic structural diagram of still another display panel according to some embodiments of this disclosure.

Optionally as illustrated in FIG. 8, the display panel further includes a first electrode layer 7 arranged at the same layer as the electrode lead line layer 10, that is, the intermediate layer 11 includes only the light-emitting function layer 8. The electrode lead line layer can be made of the same material as the first electrode layer, and the pattern of the electrode lead line layer can be formed while the pattern of the first electrode layer is being formed, thus simplifying the fabrication process.

It shall be noted that the display panel according to the embodiment of this disclosure can be an OLED display panel, and the substrate can include a plurality of layers, e.g., electrode layers. Of course, the electrode lead line layer can alternatively be arranged as one of the layers in the substrate, and for example, can be arranged at the same layer as one of the electrode layers in the substrate.

Optionally the cathodes are reused as touch electrodes. The display panel according to the embodiment of this disclosure can operate in the in-cell touch mode to thereby further improve the diversity of functions of the OLED display panel.

Figure 9:
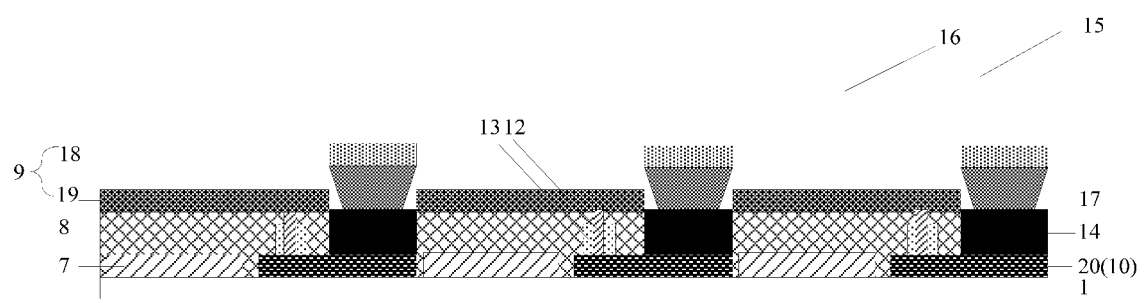
FIG. 9 is a schematic structural diagram of still another display panel according to some embodiments of this disclosure.

Optionally as illustrated in FIG. 9, the display panel is divided into non-pixel areas 15 where the pixels definition layer 14 is arranged, and a plurality of pixel areas 16 including areas surrounded by the pixels definition layer 14. The display panel further includes spacers 17 located on the pixels definition layer 14. Each cathode 9 includes a first sub-electrode 18 on the spacer, and a second sub-electrode 19 on at least the light-emitting function layer 8, and the first sub-electrode 18 is insulated from the second sub-electrode 19. The electrode lead line layer 10 includes sub-electrode lead lines 20 corresponding to and electrically connected with the second sub-electrodes 19 in a one-to-one manner. The second sub-electrodes 19 are electrically connected with the sub-electrode lead lines 20 through connection components 12 running through the light-emitting function layer 8 in the pixel areas 16.

As illustrated in FIG. 9, when the cathodes are reused as touch electrodes, the second sub-electrodes 19 are reused as the touch electrodes. The display panel further includes a plurality of thin film transistors, and the sub-electrode lead lines are connected with sources or drains of the thin film transistors so that the touch electrodes can be provided with a touch signal.

Figure 10:
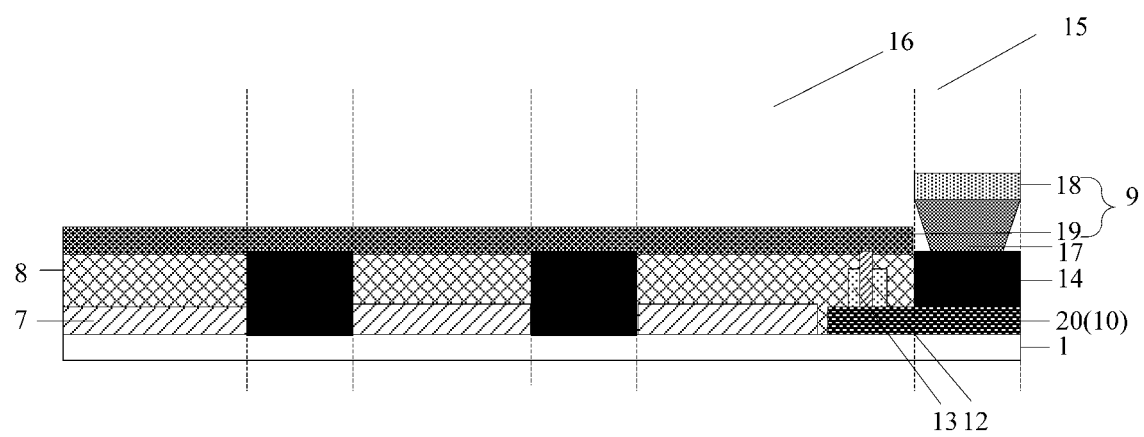
FIG. 10 is a schematic structural diagram of still another display panel according to some embodiments of this disclosure.

It shall be noted that when the second sub-electrodes are reused as the touch electrodes, each touch electrode can correspond to one of the pixel areas, and in this case, as illustrated in FIG. 9, the spacers shall be arranged on the pixels definition layer. Of course, each touch electrode can alternatively correspond to more than one of the pixel areas, and as illustrated in FIG. 10, a second sub-electrode 19 is a touch electrode covering a plurality of pixel areas and non-pixel areas, the spacers 17 are arranged on a part of the pixels definition layer 14, and the second sub-electrode 19 is arranged integral in the pixel areas and the non-pixel areas covered therewith.

When the cathode layer includes the plurality of cathode blocks, in order to insulate the respective cathode bocks from each other, the display panel further includes spacers.

The spacers are located between the intermediate layer and the cathode layer, and orthographic projections of the spacers onto the substrate do not overlap with an orthographic projection of the light-emitting function layer onto the substrate.

The spacers are configured to segment the cathode layer into a plurality of cathode blocks insulated from each other.

When the cathode layer is reused as touch electrodes, the cathode layer includes the plurality of cathode blocks insulated from each other, and in order to form the respective cathode blocks insulated from each other, the spacers are arranged in other areas than the light-emitting areas before the cathode layer is formed, and the distance between the surfaces of the spacers away from the substrate, and the substrate are more than the sum of the distance between the upper surface of the intermediate layer, and the substrate, and the thickness of the cathode layer so that there is a step between adjacent cathode blocks, so the cathode blocks are insulated from each other. The spacers can be arranged at the pixels definition layer, where the shape of the spacers can be an upside-down trapezium.

Optionally in the display panel according to the embodiment of this disclosure, the first electrode layer is an anode layer, and the light-emitting function layer, for example, can include an organic light-emitting material.

An embodiment of this disclosure provides a display device including the display panel according to the embodiments of this disclosure.

The display device according to the embodiment of this disclosure can be, for example, a mobile phone, a tablet computer, a TV set, etc.

In summary, in the display panel, the method for fabricating the same, and the display device according to the embodiments of this disclosure, the cathodes are connected with the electrode lead line layer located at a different layer from the cathodes so that a routed line space of the display panel can be saved, and the cathodes can be connected with complicated metal lines or thin film transistors through the electrode lead line layer arranged on the sides of the cathodes proximate to the substrate, that is, in the display panel according to the embodiment of this disclosure, pixel circuits of the display panel can be modified more flexibly without damaging the cathodes and the intermediate layer, so as to improve the diversity of functions of the display panel so that the display panel can be applied more widely. When the cathodes are touch electrodes, a blind touch area can be avoided from becoming too large when the touch electrodes are arranged at the same layer as touch lines, to thereby improve the touch precision and the touch effect. Furthermore the laser can be incident on the material of the connection structures from the substrate side to thereby melt the material without damaging any other layers.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A method for fabricating a display panel, comprising:
   forming a pattern of an electrode lead line layer on a substrate;
   forming connection structures on the pattern of the electrode lead line layer, wherein orthographic projections of the connection structures onto the substrate do not overlap with orthographic projections of respective light-emitting areas of the display panel onto the substrate;
   forming a pattern of an intermediate layer comprising a light-emitting function layer on the connection structures and the light-emitting areas;
   forming a pattern of cathodes on the pattern of the intermediate layer, wherein orthographic projections of the cathodes onto the substrate cover the orthographic projections of the connection structures onto the substrate; and
   irradiating the connection structures using laser from a side of the substrate so that the material of the connection structures is melt, and forming through-holes at positions on the intermediate layer corresponding to the connection structures so that the melted material electrically connects the electrode lead line layer with the cathodes through the through-holes.

2. The method according to claim 1, wherein before forming the pattern of the intermediate layer, the method further comprises:
   forming a thermally-insulating layer surrounding the connection structures, on the substrate formed with the connection structures.

3. The method according to claim 2, wherein an orthographic projection of the thermally-insulating layer onto the substrate does not overlap with the orthographic projections of the connection structures onto the substrate.

4. The method according to claim 3, wherein the thickness of the thermally-insulating layer in a direction perpendicular to the substrate ranges from 100 to 200 nanometers.

5. The method according to claim 3, wherein the thickness of the thermally-insulating layer is equal to the thickness of the connection structures in a direction perpendicular to the substrate.

6. The method according to claim 2, wherein before forming the intermediate layer, the method further comprises:
   forming a pattern of a pixels definition layer on the substrate formed with the connection structures.

7. The method according to claim 6, wherein the pixels definition layer is reused as the thermally-insulating layer.

8. The method according to claim 1, wherein before forming the cathode layer, the method further comprises:
   forming spacers on the substrate formed with the intermediate layer to segment a subsequently formed cathode layer into a plurality of cathode blocks insulated from each other.

9. The method according to claim 2, wherein forming a pattern of the thermally-insulating layer surrounding the connection structures on the electrode lead line layer comprises:
   coating a polymer material on the electrode lead line layer;
   patterning the polymer material to form the pattern of the thermally-insulating layer; and
   grinding the top of the pattern of the thermally-insulating layer to expose the connection structures.

10. The method according to claim 1, wherein while the pattern of the electrode lead line layer is being formed, the method further comprises:
    forming a pattern of a first electrode layer on the substrate using the same mask.

11. A display panel, comprising:
    a substrate, comprising a plurality of light-emitting areas;
    an electrode lead line layer, located on the substrate, and comprising a plurality of electrode lead lines;
    connection structures, located on a side of the electrode lead line layer away from the substrate, wherein orthographic projections of the connection structures onto the substrate do not overlap with orthographic projections of respective light-emitting areas of the display panel onto the substrate;
    an intermediate layer, located on sides of the connection structures away from the substrate, and comprising at least a light-emitting function layer; and
    a cathode layer, located on a side of the intermediate layer away from the substrate, wherein orthographic projections of cathodes onto the substrate cover the orthographic projections of the connection structures onto the substrate, and the connection structures run through the intermediate layer; wherein the material of the connection structures is melted under laser irradiation, and through-holes are formed in the intermediate layer, so that the melted material electrically connects the cathodes with corresponding electrode lead lines through the through-holes.

12. The display panel according to claim 11, wherein the display panel further comprises a thermally-insulating layer surrounding a part of the connection structures, on the electrode lead line layer.

13. The display panel according to claim 12, wherein an orthographic projection of the thermally-insulating layer onto the substrate does not overlap with the orthographic projections of the connection structures onto the substrate.

14. The display panel according to claim 13, wherein the thickness of the thermally-insulating layer ranges from 100 to 200 nanometers in a direction perpendicular to the substrate; or the thickness of the thermally-insulating layer is equal to the thickness of the connection structures in a direction perpendicular to the substrate.

15. The display panel according to claim 12, wherein the display panel further comprises: a pixels definition layer, wherein the pixels definition layer is located on the sides of the connection structures away from the substrate, and configured to limit a position of the light-emitting function layer.

16. The display panel according to claim 15, wherein the pixels definition layer is reused as the thermally-insulating layer.

17. The display panel according to claim 11, wherein the display panel further comprises a first electrode layer arranged at the same layer as the electrode lead line layer.

18. The display panel according to claim 11, wherein the cathodes are reused as touch electrodes.

19. The display panel according to claim 18, wherein the display panel further comprises spacers, wherein:

the spacers are located between the intermediate layer and the cathode layer, and orthographic projections of the spacers onto the substrate do not overlap with an orthographic projection of the light-emitting function layer onto the substrate; and the spacers are configured to segment the cathode layer into a plurality of cathode blocks insulated from each other.

20. A display device, comprising the display panel according to claim 11.

* * * * *